United States Patent
Chuo et al.

(10) Patent No.: US 8,803,310 B1
(45) Date of Patent: Aug. 12, 2014

(54) EMBEDDED ELECTRONIC DEVICE PACKAGE STRUCTURE

(71) Applicant: Unimicron Technology Corp., Taoyuan (TW)

(72) Inventors: Yu-Chen Chuo, New Taipei (TW); Wei-Ming Cheng, Kaohsiung (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 13/762,385

(22) Filed: Feb. 8, 2013

(51) Int. Cl.
    H01L 23/12        (2006.01)

(52) U.S. Cl.
    USPC ............ 257/700; 257/E23.062; 257/687; 257/774; 438/106; 438/125; 174/252; 174/260

(58) Field of Classification Search
    CPC ............................................. H01L 2924/01078
    USPC .......... 257/E23.062, 532, 668, 680, 686, 687, 257/691, 698, 700, 724, 737, 774, 784; 438/106, 125, 126, 618, 622, 637; 174/252, 255, 258, 260, 262; 361/719, 361/761
    See application file for complete search history.

(56) References Cited

U.S. PATENT DOCUMENTS

| | | | |
|---|---|---|---|
| 6,400,573 B1 * | 6/2002 | Mowatt et al. | 361/719 |
| 6,506,633 B1 * | 1/2003 | Cheng et al. | 438/126 |
| 6,586,827 B2 * | 7/2003 | Takeuchi et al. | 257/687 |
| 6,825,063 B2 * | 11/2004 | Vu et al. | 438/106 |
| 7,102,085 B2 * | 9/2006 | Ohta et al. | 174/260 |
| 7,342,803 B2 * | 3/2008 | Inagaki et al. | 361/763 |
| 7,396,700 B2 * | 7/2008 | Hsu | 438/107 |
| 7,923,367 B2 * | 4/2011 | Machida | 438/637 |
| 7,947,906 B2 * | 5/2011 | Lee et al. | 174/252 |
| 8,058,721 B2 * | 11/2011 | Hsu | 257/692 |
| 8,116,066 B2 * | 2/2012 | Inoue | 361/321.4 |
| 8,178,963 B2 * | 5/2012 | Yang | 257/691 |
| 8,222,747 B2 * | 7/2012 | Machida | 257/777 |
| 8,237,060 B2 * | 8/2012 | Tanaka | 174/260 |
| 8,614,502 B2 * | 12/2013 | Lin et al. | 257/668 |
| 8,654,538 B2 * | 2/2014 | Kariya et al. | 361/761 |

FOREIGN PATENT DOCUMENTS

| | | |
|---|---|---|
| TW | 200841815 | 10/2008 |
| TW | 201003870 | 1/2010 |

* cited by examiner

Primary Examiner — Chris Chu
(74) Attorney, Agent, or Firm — Jianq Chyun IP Office

(57) ABSTRACT

An embedded electronic device package structure includes a core layer, an electronic device, a first dielectric layer, a second dielectric layer and conductive vias. The core layer has cavity, a first surface and a second surface opposite to the first surface. The electronic device is disposed in the cavity. The first dielectric layer disposed on the first surface is filled in part of the cavity and covers one side of the electronic device. The second dielectric layer disposed on the second surface is filled in the cavity, covers another side of the electronic device and connects the first dielectric layer. The first and the second dielectric layers fully cover the electronic device. The conductive vias are disposed around the surrounding of the electronic device and penetrates through the first and the second dielectric layer and the core layer. The conductive vias respectively connects the first and the second dielectric layer.

10 Claims, 2 Drawing Sheets

EMBEDDED ELECTRONIC DEVICE PACKAGE STRUCTURE

BACKGROUND OF THE INVENTION

1. Field of the Invention

The present invention relates to a package structure, in particular, to an embedded electronic device package structure.

2. Description of Related Art

The complication of semiconductor devices has been increased, and at least part of the reasons is user's demands for increasing processing speed and decreasing the sizes of the devices. Although the advantages of increasing processing speed and decreasing sizes of the devices are significant, they also cause property problems of the semiconductor device. In particular, higher clock speed may increase the frequency of converting signal level, such that the strength of electromagnetic emission with higher frequency or shorter wavelength is increased. Electromagnetic emission may radiate from a source semiconductor device and emit into a neighboring semiconductor device. If the electromagnetic emission emitting toward the neighboring semiconductor device is strong enough, the electromagnetic emission may affect operation of the (neighboring) semiconductor device. This phenomenon sometimes is called electromagnetic interference (EMI). Semiconductor devices with smaller sizes suffer from EMI issue more seriously, because the semiconductor devices (with smaller sizes) are disposed in an electronic system with higher density, such that the neighboring semiconductor devices receive stronger and unwanted electromagnetic emission.

One way to diminish the electromagnetic interference is to shield one set of the semiconductor devices in the semiconductor device package. In particular, by disposing grounding conductive casing or conductive housing at the outside of the package structure, shielding effect is achieved. When the electromagnetic emission radiates from the inside of the package structure toward the inner surface of the casing, at least part of the electromagnetic emission is shorted, so as to diminish the strength of the electromagnetic emission which is capable of penetrating the casing and affecting the operation of the neighboring semiconductor devices. Similarly, when the electromagnetic emission radiates from the neighboring semiconductor devices toward the outer surface of the casing, the similar shorted situation happens, so as to diminish the electromagnetic interference affecting the semiconductor devices in the package structure.

However, even though the conductive casing may diminish the electromagnetic interference, there are a lot of disadvantages in using the conductive casing, for example, the casing generally is fixed at the outside of the semiconductor device package by adhesive paste, and because the stickiness of the adhesive paste may decrease due to temperature, humidity and other environmental factors, the casing may easily peel off or fall off. Moreover, the size and the shape of the casing need to correspond to the size and the shape of the package structure, thus, different sizes and shapes of semiconductor device packages need to go with different casings to contain different package structures. This would further increase production cost and time. More importantly, the casing covering the outside of the semiconductor device would increase the volume of the package structure, so the package volume may not be effectively decreased, and this type of casing may not be applied to embedded electronic device package structure with higher package density, which is against the market demands for light, thin, short, small, high density, and function-integrated electronic products.

SUMMARY OF THE INVENTION

The present invention is directed to an embedded electronic device package structure, which the volume thereof is small and has the function electromagnetic shielding.

The present invention provides an embedded electronic device package structure including a core layer, an electronic device, a first dielectric layer, a second dielectric layer and a plurality of conductive vias. The core layer has a cavity, a first surface and a second surface opposite to the first surface. The electronic device is disposed in the cavity. The first dielectric layer disposed on the first surface is filled in the cavity, and covers one side of the electronic device. The first dielectric layer is filled in part of the cavity. The second dielectric layer disposed on the second surface is filled in the cavity, and covers another side of the electronic device. The second dielectric layer is connected with the first dielectric layer. The first dielectric layer and the second dielectric layer fully cover the electronic device. The conductive vias are disposed around the surrounding of the electronic device and penetrates through the first dielectric layer, the second dielectric layer and the core layer. The conductive vias respectively connect the first dielectric layer and the second dielectric layer.

According to an embodiment of the present invention, the conductive vias include plated through holes (PTH).

According to an embodiment of the present invention, each of the conductive vias includes a first conductive via and a plurality of second conductive vias. The first conductive via penetrates through the core layer. The second conductive vias respectively connect from two opposing ends of the first conductive via to the first dielectric layer and the second dielectric layer.

According to an embodiment of the present invention, the embedded electronic device package structure further includes a plurality of conductive layers respectively filled in the conductive vias.

According to an embodiment of the present invention, the embedded electronic device package structure further includes a plurality of conductive layers respectively covering the inner surface of the conductive vias.

According to an embodiment of the present invention, the first conductive via includes plated through hole.

According to an embodiment of the present invention, the first conductive via includes laser through hole.

According to an embodiment of the present invention, the embedded electronic device package structure further includes a plurality of conductive poles. The electronic device further includes a plurality of pads facing the first dielectric layer. The conductive poles respectively connect from the pads to the first dielectric layer.

According to an embodiment of the present invention, the conductive poles include laser vias.

According to an embodiment of the present invention, the embedded electronic device package structure further includes an adhesive layer filled between the pads.

Based on the description above, in the embedded electronic device package structure of the present invention, the conductive vias penetrate through the first dielectric layer and the second dielectric layer and are disposed around the electronic device embedded in the first dielectric layer and the second dielectric layer. The inner surface of each conductive via is covered with metal conductive layer, such that the conductive vias not only are the paths of electrical connection, but also provides the electronic device with the function of electromagnetic shielding. Accordingly, the embedded electronic device package structure of the present invention takes advantage of the existing space and structure in the package structure, such that no extra shielding cover is needed to be disposed in the embedded electronic device package structure to provide the electronic device with the function of electromagnetic shielding. Therefore, the present invention not only decreases the package volume, simplifies the manufacturing process, but also saves the production cost of the shielding casing.

In order to make the aforementioned and other features and advantages of the invention more comprehensible, embodiments accompanying figures are described in detail below.

DESCRIPTION OF EMBODIMENTS

Figure 1:
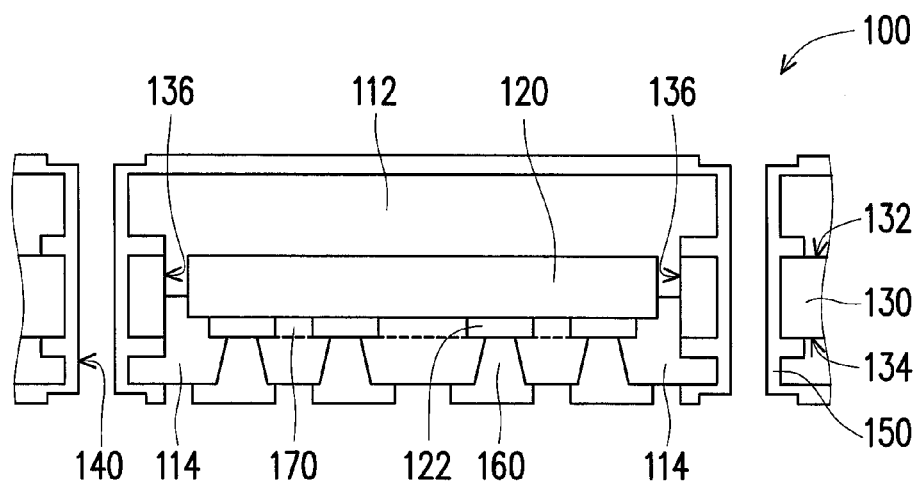
FIG. 1 is a schematic cross-sectional view of an embedded electronic device package structure according to an embodiment of the present invention.
Figure 2:
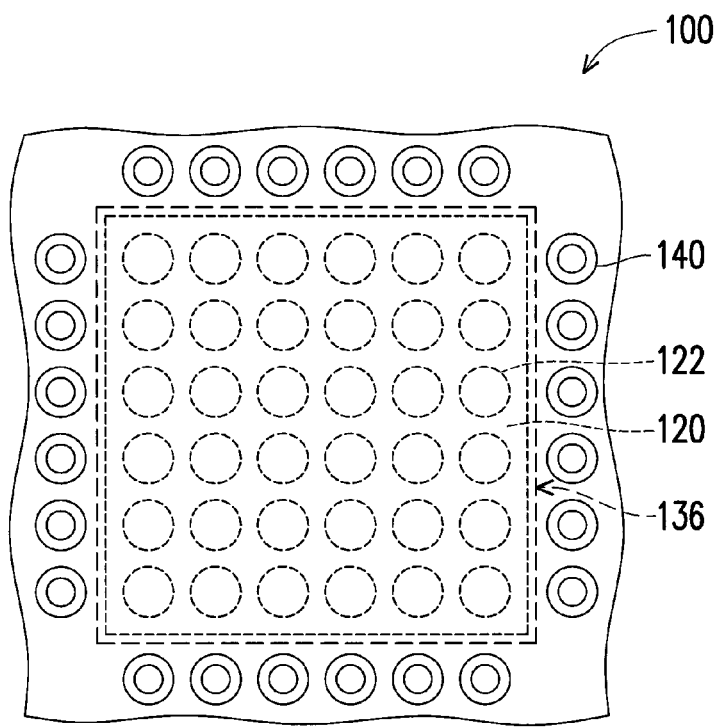
FIG. 2 is a schematic top view of the embedded electronic device package structure in FIG. 1.

FIG. 1 is a schematic cross-sectional view of an embedded electronic device package structure according to an embodiment of the present invention. FIG. 2 is a schematic top view of the embedded electronic device package structure in FIG. 1. Referring to both FIG. 1 and FIG. 2, the embedded electronic device package structure 100 includes a core layer 130, an electronic device 120, a first dielectric layer 112, a second dielectric layer 114 and a plurality of conductive vias 140. The core layer 130 has a cavity 136, a first surface 132 and a second surface 134 opposite to the first surface 132. The electronic device 120 is disposed in the cavity 136 of the core layer 130. The first dielectric layer 112 and the second dielectric layer 114 are respectively pressed onto the top surfaces and the bottom surfaces of the electronic device 120 and the core layer 130 from the top and the bottom, such that the electronic device 120 and the core layer 130 are covered by the first dielectric layer 112 and the second dielectric layer 114. In the present embodiment, the electronic device 120 is, for example, a chip. The embedded electronic device package structure 100 further includes a plurality of conductive poles 160. The electronic device 120 further includes a plurality of pads 122, wherein the pads 122 facing the first dielectric layer 112. The conductive poles 160 respectively connect from the pads 122 to the first dielectric layer 112. The conductive poles 160 are formed as laser vias by, for example, laser drilling, and then conductive material is filled in the laser vias by, for example, electroplating, so as to enable the pads 122 of the electronic device 120 to be electrically connected to the outer surface of the first dielectric layer 112. Furthermore, in the present embodiment, the embedded electronic device package structure 100 further includes an adhesive layer 170 filled between the pads 122.

Accordingly, the conductive vias 140 are, as shown in FIG. 2, respectively disposed around the surrounding of the electronic device 120, and penetrate through the first dielectric layer 112, the second dielectric layer 114 and the core layer 130 surrounding the electronic device 120. Each of the conductive vias 140 connects the first dielectric layer 112 and the second dielectric layer 114. In the present embodiment, the embedded electronic device package structure 100 further includes a plurality of conductive layers 150 respectively covering the inner surfaces of the conductive vias 140, so as to electrically connect the first dielectric layer 112 and the second dielectric layer 114. The conductive vias 140 are, for example, plated through holes, which mean the conductive vias 140 are through holes, and the conductive layers 150 are respectively formed on the inner walls of the conductive vias 140 by electroplating.

As the disposition described above, the embedded electronic device package structure 100 of the present invention is capable of having the conductive vias 140, as shown in FIG. 2, penetrating through the dielectric layers 112, 114, also, the conductive vias 140 are disposed around the surrounding of the electronic device 120 embedded in the dielectric layers 112, 114, and the inner walls of the conductive vias 140 are covered by metal layers, such that the conductive vias 140 not only are the paths of electrically connection, but also provide the electronic device 120 with electromagnetic shielding. Therefore, the embedded electronic device package structure 100 of the present invention takes advantage of the existing space and structure in the package structure, such no extra shielding cover is needed to be disposed in the embedded electronic device package structure 100 to provide the electronic device 120 with the function of electromagnetic shielding.

Figure 3:
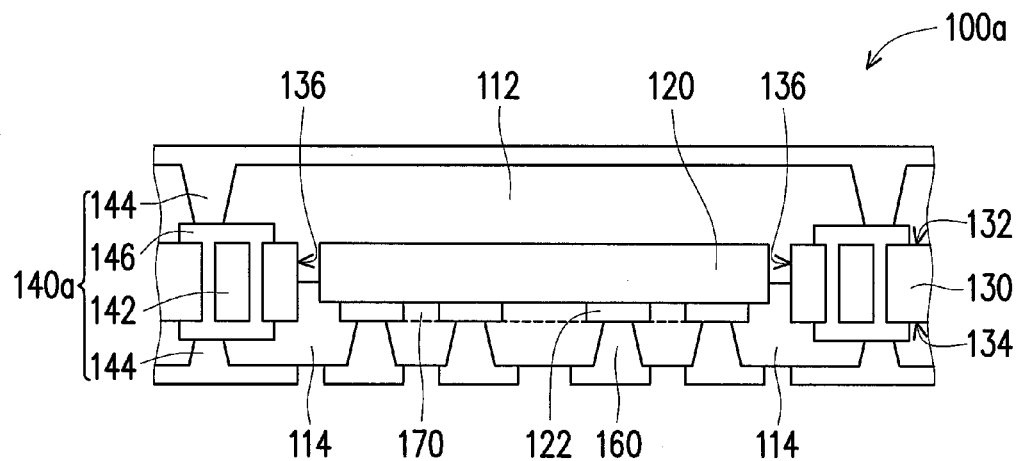
FIG. 3 is a schematic cross-sectional view of an embedded electronic device package structure according to another embodiment of the present invention.

FIG. 3 is a schematic cross-sectional view of an embedded electronic device package structure according to another embodiment of the present invention. It is noted that the embodiment illustrated in FIG. 3 uses the same reference numerals and partial content of the previous embodiment. The same reference numerals represent similar components, and repeated description is omitted. Those not described in the following embodiment can be referred to in the above embodiment. Referring to FIG. 3, each of the conductive vias 140a of the embedded electronic device package structure 100a in the present embodiment includes a first conductive via 140 and a plurality of second conductive vias 144. The first conductive via 142 penetrates through the core layer 130. The second conductive vias 144 respectively penetrate through the first dielectric layer 112 and the second dielectric layer 114, so as to respectively connect from two opposing ends of the first conductive via 142 to the outer surfaces of the first dielectric layer 112 and the second dielectric layer 114 to electrically connect the first dielectric layer 112 and the second dielectric layer 114. In the present embodiment, the first conductive via 142 is, for example, plated through hole penetrating the core layer 130, which means the first conductive via 142 is a through hole, and metal conductive layer is respectively formed on the inner wall of the first conductive via 142 by electroplating. The second conductive vias 144 are formed as laser vias connecting the first conductive via 142 by, for example, laser drilling, and then metal conductive material is filled in the laser vias by, for example, electroplating, so as to respectively connect from the two opposing ends of the first conductive via 142 to the first surface 112 and the second surface 114. Moreover, in the present embodiment, patterned conductive layers 146 may further be disposed on the two opposing ends of the first conductive via 142 to extending the electrically conductive range, such that the second conductive vias 144 only have to connect to the patterned conductive layers 146 to be electrically connected to the first conductive via 142 through the patterned conductive layers 146, so as to increase the disposition flexibility of the second conductive vias 144 and the tolerance for alignment errors occurring in manufacture processes.

As the disposition described above, the present embodiment adopts the conductive vias including the first conductive via 142 penetrating the core layer 130 and the second conductive vias 144 respectively connecting from two opposing ends of the first conductive via 142 to the outer surfaces of the first dielectric layer 112 and the second dielectric layer 114, and makes the conductive vias 142, 144 disposed around the surrounding of the electronic device 120 to electrically connect the first dielectric layer 112 and the second dielectric layer 114. The present embodiment further uses the metal conductive material in the conductive vias 142, 144 to provide the electronic device 120 with the function of electromagnetic shielding. Therefore, the present embodiment adopts the conductive vias 142, 144 designed to be the paths of electrical connection in the embedded electronic device package structure 100*a* to provide the electronic device 120 with electromagnetic shielding. Accordingly, the embedded electronic device package structure 100*a* takes advantage of the existing space and structure in the package structure, such that no extra shielding cover is needed to be disposed in the embedded electronic device package structure 100*a* to provide the electronic device 120 with the function of electromagnetic shielding.

Figure 4:
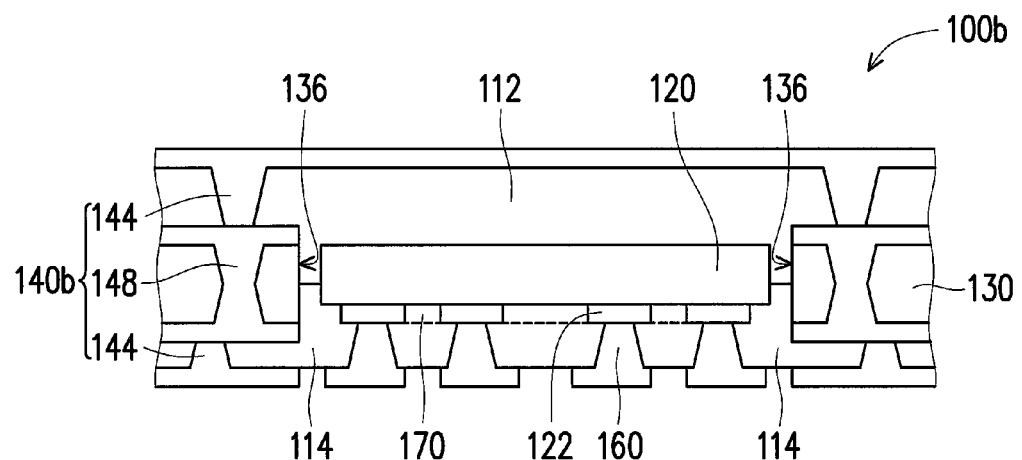
FIG. 4 is a schematic cross-sectional view of an embedded electronic device package structure according to another embodiment of the present invention.

FIG. 4 is a schematic cross-sectional view of an embedded electronic device package structure according to another embodiment of the present invention. It is noted that the embodiment illustrated in FIG. 4 uses the same reference numerals and partial content of the previous embodiment illustrated in FIG. 3. The same reference numerals represent similar components, and repeated description is omitted. Those not described in the following embodiment can be referred to in the above embodiment. Referring to FIG. 4, each of the conductive vias 140*b* of the embedded electronic device package structure 100*b* in the present embodiment includes a first conductive via 148 and a plurality of second conductive vias 144. The first conductive via 148 penetrates through the core layer 130. However, in the present embodiment, the first conductive via 148 are formed as two laser vias respectively on a top side and a bottom side of the core layer by, for example, laser drilling. The two laser vias are connected to each other and together penetrate the core layer 130, and then metal conductive material is filled in the first conductive via 148 described above by, for example, electroplating. The second conductive vias 144 are formed as laser vias connecting the first conductive via 148 by, for example, laser drilling, and then metal conductive material is filled in the laser vias by, for example, electroplating, so as to respectively connect from the two opposing ends of the first conductive via 148 to the outer surfaces of the first dielectric layer 112 and the second dielectric layer 114, thus, the first dielectric layer 112 is electrically connected to the second dielectric layer 114. It is noted that the above-mentioned embodiments are merely exemplary, and the present invention is not limited thereto. It will be apparent to one of the ordinary skill in the art that modifications to the described embodiment may be made without departing from the spirit of the invention. Any embedded electronic device package structure that uses the conductive vias therein, which penetrates the package structure and are disposed around the electronic device, to provide the electronic device with electromagnetic shielding would fall within the scope of the invention.

Based on the description above, in the embedded electronic device package structure of the present invention, the conductive vias penetrate through the first dielectric layer and the second dielectric layer and are disposed around the electronic device embedded in the first dielectric layer and the second dielectric layer. The inner surface of each conductive via is covered with metal conductive layer, such that the conductive vias not only are the path of electrical connection, but also provides the electronic device with the function of electromagnetic shielding. Accordingly, the embedded electronic device package structure of the present invention takes advantage of the existing space and structure in the package structure, such that no extra shielding cover is needed to be disposed in the embedded electronic device package structure to provide the electronic device with the function of electromagnetic shielding. Therefore, the present invention not only decreases the package volume, simplifies the manufacturing process, but also saves the production cost of the shielding casing.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. An embedded electronic device package structure, comprising:
   a core layer, having a cavity, a first surface and a second surface opposite to the first surface;
   an electronic device, disposed in the cavity of the core layer;
   a first dielectric layer, disposed on the first surface of the core layer, and filled in the cavity of the core layer, the first dielectric layer covering one side of the electronic device, wherein the first dielectric layer is filled in part of the cavity;
   a second dielectric layer, disposed on the second surface of the core layer, and filled in the cavity of the core layer, the second dielectric layer covering another side of the electronic device, wherein the first dielectric layer and the second dielectric layer fully cover the electronic device; and
   a plurality of conductive vias, disposed around the surrounding of the electronic device and penetrating through the first dielectric layer, the second dielectric layer and the core layer, the conductive vias respectively connecting the first dielectric layer and the second dielectric layer.

2. The embedded electronic device package structure as claimed in claim 1, wherein the conductive vias comprise plated through holes (PTH).

3. The embedded electronic device package structure as claimed in claim 1, wherein each of the conductive vias comprises a first conductive via and a plurality of second conductive vias, the first conductive via penetrates through the core layer, the second conductive vias connect respectively from two opposing ends of the first conductive via to the first dielectric layer and the second dielectric layer.

4. The embedded electronic device package structure as claimed in claim 3, wherein the first conductive via comprises plated through hole (PTH).

5. The embedded electronic device package structure as claimed in claim 3, wherein the first conductive via comprises laser through hole.

6. The embedded electronic device package structure as claimed in claim 1, further comprising a plurality of conductive layers, respectively filled in the conductive vias.

7. The embedded electronic device package structure as claimed in claim 1, further comprising a plurality of conductive layers, respectively cover the inner surfaces of the conductive vias.

8. The embedded electronic device package structure as claimed in claim 1, further comprising a plurality of conductive poles, the electronic device further comprising a plurality of pads facing the first dielectric layer, and the conductive poles respectively connecting from the pads to the first dielectric layer.

9. The embedded electronic device package structure as claimed in claim 8, wherein the conductive poles comprise laser vias.

10. The embedded electronic device package structure as claimed in claim 8, further comprising an adhesive layer, filled between the pads.

* * * * *